(12) United States Patent
Zhang et al.

(10) Patent No.: US 12,444,652 B2
(45) Date of Patent: Oct. 14, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Wen-Wen Zhang, Changhua County (TW); Ming-Chou Lu, Pingtung County (TW); Kun-Chen Ho, Tainan (TW); Dien-Yang Lu, Kaohsiung (TW); Chun-Lung Chen, Tainan (TW); Chung-Yi Chiu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 450 days.

(21) Appl. No.: 17/868,786

(22) Filed: Jul. 20, 2022

(65) Prior Publication Data
US 2023/0411213 A1 Dec. 21, 2023

(30) Foreign Application Priority Data
Jun. 17, 2022 (TW) .................................. 111122664

(51) Int. Cl.
*H01L 21/768* (2006.01)
*H01L 21/311* (2006.01)
*H01L 23/528* (2006.01)
*H10D 64/01* (2025.01)

(52) U.S. Cl.
CPC .. *H01L 21/76897* (2013.01); *H01L 21/31116* (2013.01); *H01L 21/7682* (2013.01); *H01L 21/76832* (2013.01); *H01L 23/528* (2013.01); *H10D 64/017* (2025.01)

(58) Field of Classification Search
CPC ......... H01L 21/76897; H01L 21/31116; H01L 21/7682; H01L 21/76832; H01L 23/528; H01L 29/66545
See application file for complete search history.

(56) References Cited

U.S. PATENT DOCUMENTS

| | | | |
|---|---|---|---|
| 6,211,057 B1 | 4/2001 | Lin et al. | |
| 6,917,109 B2 | 7/2005 | Lur et al. | |
| 10,411,107 B2* | 9/2019 | Schutz | H10D 64/021 |
| 2017/0330790 A1* | 11/2017 | He | H01L 23/66 |
| 2020/0127110 A1* | 4/2020 | Lee | H10D 64/254 |
| 2021/0066489 A1* | 3/2021 | Xie | H10D 30/6219 |
| 2021/0327813 A1* | 10/2021 | Singh | H01L 21/7682 |
| 2022/0270970 A1* | 8/2022 | Chan | H01L 23/53276 |
| 2022/0320094 A1* | 10/2022 | Lee | H10D 84/0158 |
| 2023/0034125 A1* | 2/2023 | Wu | H01L 21/7682 |
| 2023/0154791 A1* | 5/2023 | Chung | H01L 21/76805 257/751 |

FOREIGN PATENT DOCUMENTS

TW 202213688 A 4/2022

* cited by examiner

*Primary Examiner* — Zandra V Smith
*Assistant Examiner* — Andre C Stevenson
(74) *Attorney, Agent, or Firm* — Winston Hsu

(57) ABSTRACT

A method for fabricating a semiconductor device includes the steps of forming a gate structure on a substrate, forming a contact etch stop layer (CESL) on the gate structure, forming an interlayer dielectric (ILD) layer on the CESL, forming a contact plug in the ILD layer and adjacent to the gate structure, forming a first stop layer on the ILD layer, and removing the first stop layer and the ILD layer around the gate structure to form an air gap exposing the CESL.

15 Claims, 4 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of forming air gap around gate structure.

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance.
The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the VLSI technology. For this reason, prior art attempts to reduce the RC delays have focused on utilizing material with a low-k to fill the gaps between the metal lines.

Silicon dioxide ($SiO_2$) has been conventionally preferred as a dielectric material even though it has a relatively high dielectric constant (relative to vacuum) of about 4.1 to 4.5 because it is a thermally and chemically stable material and conventional oxide etching techniques are available for high-aspect-ratio contacts and via holes. However, as device dimensions decrease and the packing density increases, it is necessary to reduce the spacing between conductive lines to effectively wire up the integrated circuits. Therefore, a large number of lower dielectric constant materials are currently being investigated to reduce the RC value of the chip further. These include among many others fluorinated $SiO_2$, aerogels, and polymers. Another method being proposed to lower the dielectric constant even further is to form air gaps between the interconnect lines. While silicon dioxide has a dielectric constant of about 4 and greater, the dielectric constant of air is about 1.

Although air is the best dielectric material for lowering the RC value, unfortunately the use of air gap structures in integrated circuit fabrication has been hindered with problems. Overall mechanical strength of the device is reduced correspondingly and lead to structural deformation and a weakened structure can have serious effect in various aspects of subsequent integrated circuit fabrication. Accordingly, what is needed in the art is an air gap interconnect structure and method of manufacture thereof that addresses the above-discussed issues.

SUMMARY OF THE INVENTION

According to an embodiment of the present invention, a method for fabricating a semiconductor device includes the steps of forming a gate structure on a substrate, forming a contact etch stop layer (CESL) on the gate structure, forming an interlayer dielectric (ILD) layer on the CESL, forming a contact plug in the ILD layer and adjacent to the gate structure, forming a first stop layer on the ILD layer, and removing the first stop layer and the ILD layer around the gate structure to form an air gap exposing the CESL.

According to another aspect of the present invention, a semiconductor device includes a gate structure on a substrate, a contact etch stop layer (CESL) on the gate structure, an interlayer dielectric (ILD) layer on the CESL, a contact plug in the ILD layer and adjacent to the gate structure, a first stop layer on the ILD layer, and an air gap around the gate structure and exposing the CESL.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
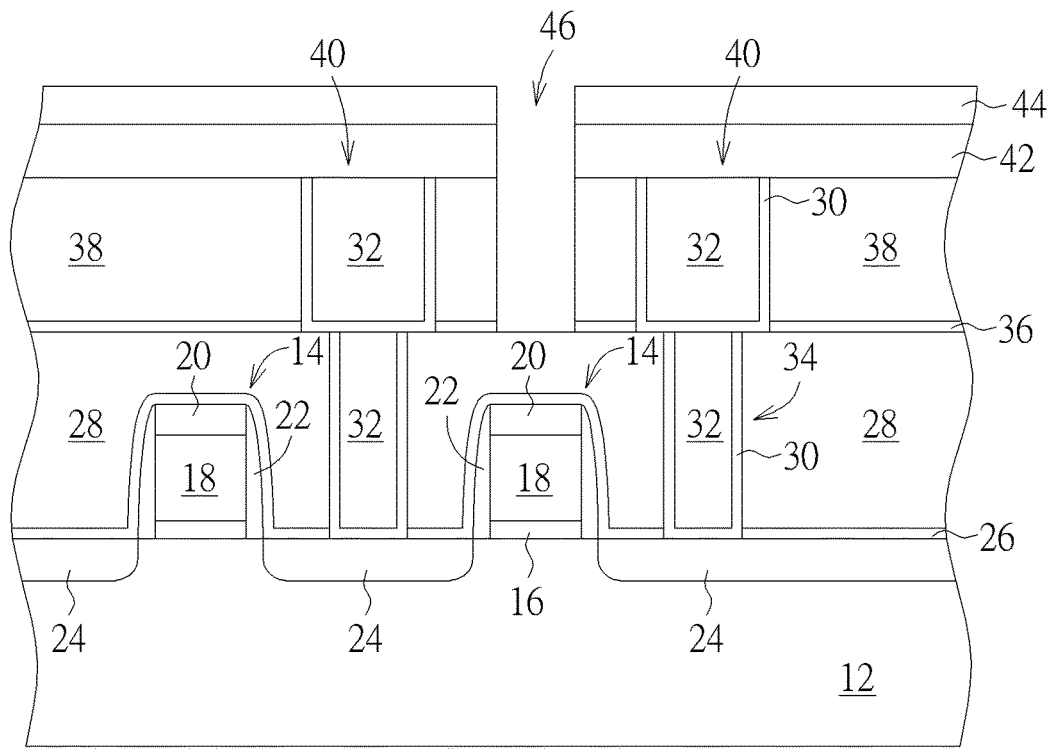
FIGS. 1-4 illustrate a method for fabricating semiconductor device according to an embodiment of the present invention.

Referring to FIGS. 1-4, FIGS. 1-4 illustrate a method for fabricating semiconductor device according to an embodiment of the present invention. As shown in FIG. 1, a substrate 12 is first provided, in which the substrate could be a silicon substrate or silicon-on-insulator (SOI) substrate. A transistor region, such as a PMOS region or a NMOS region could be defined on the substrate 12 and one or more shallow trench isolation (STI) made of silicon oxide could be formed in the substrate 12 for electrical isolation. It should be noted that even though the present invention pertains to a method for fabricating planar field effect transistor (FET), according to other embodiment of the present invention, the following process could also be employed for fabricating non-planar devices such as fin field effect transistor (FinFET) device. In this instance, the substrate 12 shown in FIG. 1 would then be fin-shaped structures disposed on the substrate 12.

According to an embodiment of the present invention, the fin-shaped structures could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures could also be obtained by first forming a patterned mask (not shown) on the substrate, 12, and through an etching process, the pattern of the patterned mask is transferred to the substrate 12 to form the fin-shaped structure. Moreover, the formation of the fin-shaped structures could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures. These approaches for forming fin-shaped structures are all within the scope of the present invention.

Next, at least a gate structures 14 or dummy gate is formed on the substrate 12. In this embodiment, the formation of the gate structure 14 could be accomplished by a gate first process, a high-k first approach from gate last process, or a high-k last approach from gate last process. Since this embodiment pertains to a high-k first approach, a gate dielectric layer 16 or interfacial layer, a gate material layer 18 made of polysilicon, and a selective hard mask 20 could be formed sequentially on the substrate 12, and a pattern transfer process is then conducted by using a patterned resist (not shown) as mask to remove part of the hard mask 20, part of the gate material layer 18, and part of the gate dielectric layer 16 through single or multiple etching processes. After stripping the patterned resist, a gate structure 14 made of a patterned gate dielectric layer 16, a patterned gate material layer 18, and a patterned hard mask 20 is formed on the substrate 12.

Next, at least a spacer 22 is formed on the sidewalls of the gate structure 14, a source/drain region 24 and/or epitaxial layer (not shown) is formed in the substrate 12 adjacent to two sides of the spacer 22, and a selective silicide layer (not shown) could be formed on the surface of the source/drain region 24. In this embodiment, the spacer 22 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain region 24 could include n-type dopants or p-type dopants depending on the type of device being fabricated.

Next, a contact etch stop layer (CESL) 26 is formed on the substrate 12 surface and the gate structure 14, and an interlayer dielectric (ILD) layer 28 is formed on the CESL 26 afterwards. Next, a photo-etching process is conducted by using a patterned mask (not shown) as mask to remove part of the ILD layer 28 and part of the CESL 26 for forming contact holes (not shown) exposing the source/drain region 24. Next, conductive materials including a barrier layer 30 selected from the group consisting of titanium (Ti), titanium nitride (TiN), tantalum (Ta), and tantalum nitride (TaN) and a metal layer 32 selected from the group consisting of tungsten (W), copper (Cu), aluminum (Al), titanium aluminide (TiAl), and cobalt tungsten phosphide (CoWP) are deposited into the contact holes, and a planarizing process such as chemical mechanical polishing (CMP) is conducted to remove part of aforementioned barrier layer 30 and metal layer 32 for forming contact plugs 34 electrically connecting the source/drain region 24.

It should be noted that even though a gate structure made of polysilicon is disclosed in this embodiment, according to other embodiment of the present invention, it would also be desirable to conduct a replacement metal gate (RMG) process to transform the gate structure 14 into metal gate after forming the ILD layer 28 and before forming the conduct plugs 34. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard mask 20, the gate material layer 18, and even the gate dielectric layer 16 from gate structure 14 for forming a recess (not shown) in the ILD layer 28. Next, a selective interfacial layer or gate dielectric layer (not shown), a high-k dielectric layer, a work function metal layer, and a low resistance metal layer are formed in the recesses, and a planarizing process such as CMP is conducted to remove part of low resistance metal layer, part of work function metal layer, and part of high-k dielectric layer to form a metal gate. If a high-k last approach were conducted to transform the polysilicon gate structure into metal gate, the metal gate would include an interfacial layer or gate dielectric layer, a U-shape high-k dielectric layer, a U-shape work function metal layer, and a low resistance metal layer.

According to an embodiment of the present invention, the high-k dielectric layer is preferably selected from dielectric materials having dielectric constant (k value) larger than 4. For instance, the high-k dielectric layer may be selected from hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer is formed for tuning the work function of the metal gate in accordance with the conductivity of the device. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity.

Next, at least a metal interconnect structure is formed on the ILD layer 28 to electrically connect the contact plugs 34, in which the metal interconnect structure includes a stop layer 36, an inter-metal dielectric (IMD) layer 38, and metal interconnections 40 embedded in the IMD layer 38. In this embodiment, each of the metal interconnections 40 from the metal interconnect structure preferably includes a trench conductor, in which each of the metal interconnections 40 from the metal interconnect structure could be embedded within the IMD layer 38 according to a single damascene process or dual damascene process. For instance, each of the metal interconnections 40 could further include a barrier layer 30 and a metal layer 32, in which the barrier layer 30 could be selected from the group consisting of titanium (Ti), titanium nitride (TiN), tantalum (Ta), and tantalum nitride (TaN) and the metal layer 32 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity.

In this embodiment, the metal layers 32 are preferably made of copper, the IMD layer 38 is preferably made of silicon oxide such as tetraethyl orthosilicate (TEOS) or ultra low-k (ULK) dielectric layer, and the stop layer 36 is preferably made of nitrogen doped carbide (NDC), silicon nitride, silicon carbon nitride (SiCN), or combination thereof.

Next, a stop layer 42 and another hard mask 44 are formed on the IMD layer 38 and metal interconnection 40, a photo-etching process or more specifically an anisotropic etching such as dry etching process is conducted by first forming a patterned mask (not shown) such as patterned resist on the hard mask 44, and then a fluorine-containing gas is injected by using the patterned mask as mask to remove part of the hard mask 44, part of the stop layer 42, part of the IMD layer 38, and part of the stop layer 36 for forming an opening 46 exposing the top surface of the ILD layer 28 and sidewalls of the IMD layer 38. In this embodiment, the stop layer 42 and the stop layer 36 are preferably made of same material such as SiCN, the hard mask 44 is preferably made of metal nitride such as TiN, and the thickness of the stop layer 36 is less than the thickness of the stop layer 42 atop. According to an embodiment of the present invention, the thickness of the stop layer 36 is between 270-330 Angstroms or most preferably 300 Angstroms, the thickness of the stop layer 42 is between 480-600 Angstroms or most preferably 540 Angstroms, and the thickness of the hard mask 44 is between 270-330 Angstroms or most preferably 300 Angstroms.

Figure 2:
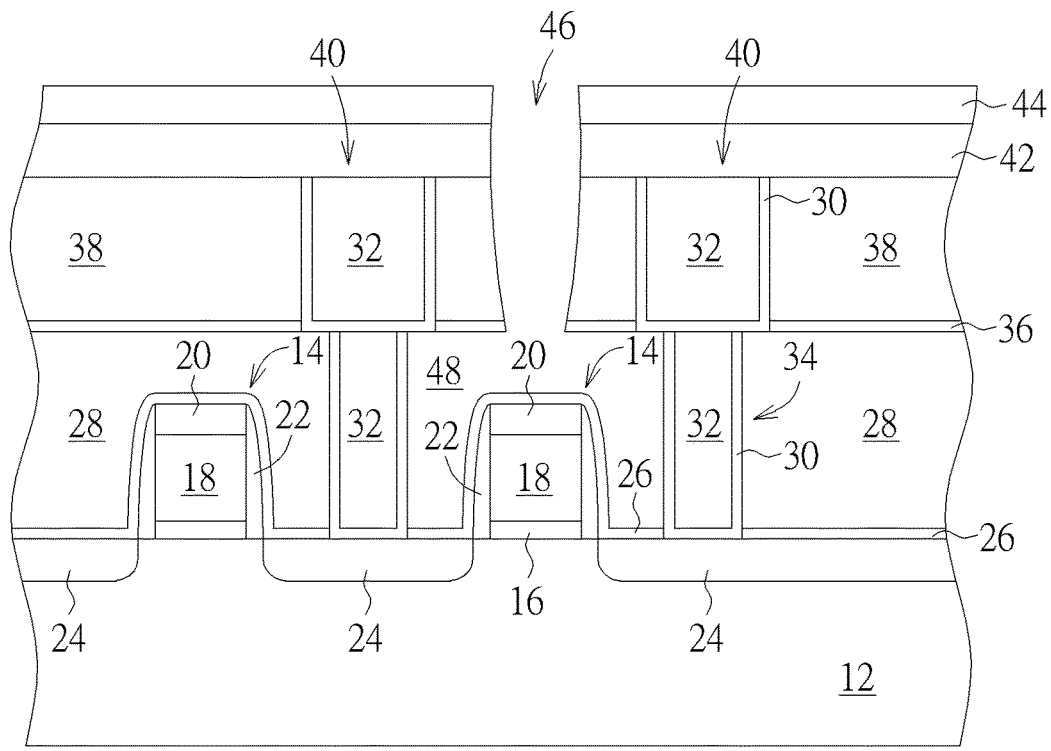

Next, as shown in FIG. 2, another photo-etching process or more specifically an isotropic etching process such as wet etching process is conducted by using diluted hydrofluoric acid (dHF) to remove part of the ILD layer 28 for exposing the CESL 26 on top of the gate structure 14. Preferably, the etching process conducted at this stage removes all of the ILD layer 28 surrounding the gate structure 14 or more specifically all of the ILD layer 28 around the gate structure 14 and between the contact plugs 34 that are adjacent to two sides of the gate structure 14. This extends the opening 46 downward to form an air gap 48 surrounding the gate structure 14, in which the air gap 48 exposes the CESL 26 and sidewalls of the contact plugs 34 but does not expose any part of the gate structure 14 including the hard mask 20 and/or the spacer 22. It should also be noted that the etching process conducted during the formation of the air gap 48 preferably removes more of the stop layer 42 on the top and less of the stop layer 36 on the bottom so that the width of the opening 46 between the patterned stop layer 42 would become slightly bigger than the width of the opening 46 between the patterned stop layer 36 thereby forming an air gap 48 or opening 46 with wide top and narrow bottom. Moreover, the etchant used at this stage may also remove part of the sidewalls of the stop layer 36, the IMD layer 38, and the stop layer 42 to form curve sidewalls instead of linear or vertical sidewalls.

Figure 3:
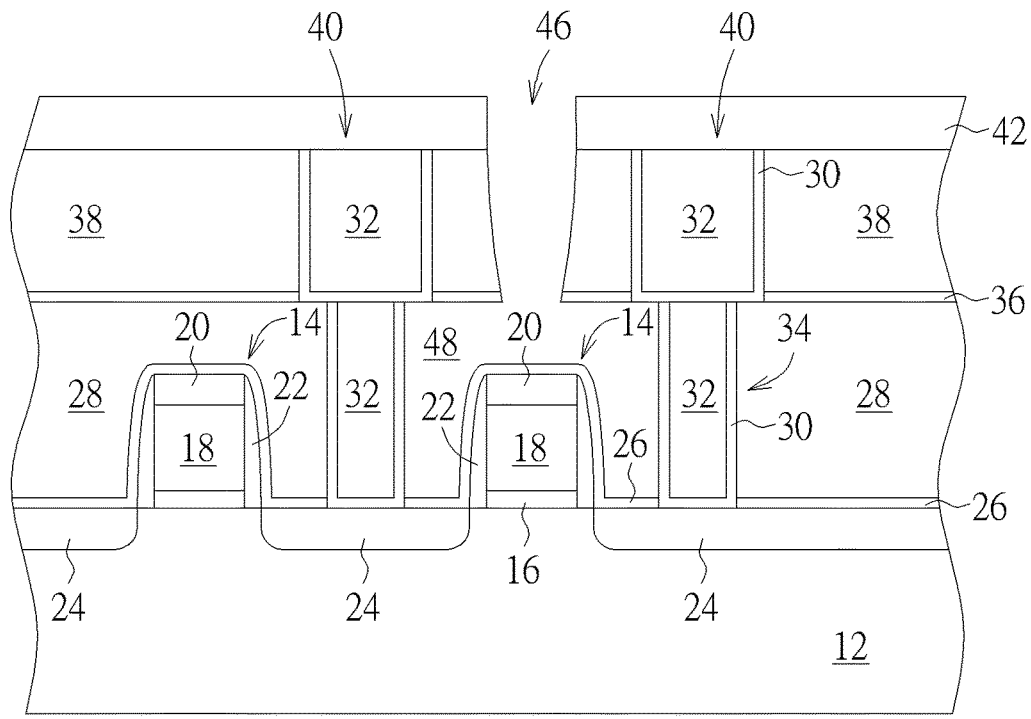

Next, as shown in FIG. 3, an etching or cleaning process is conducted without forming patterned mask to use a cleaning agent such as Standard Clean 1 (SC1) to completely remove the hard mask 44 and expose the stop layer 42.

Figure 4:
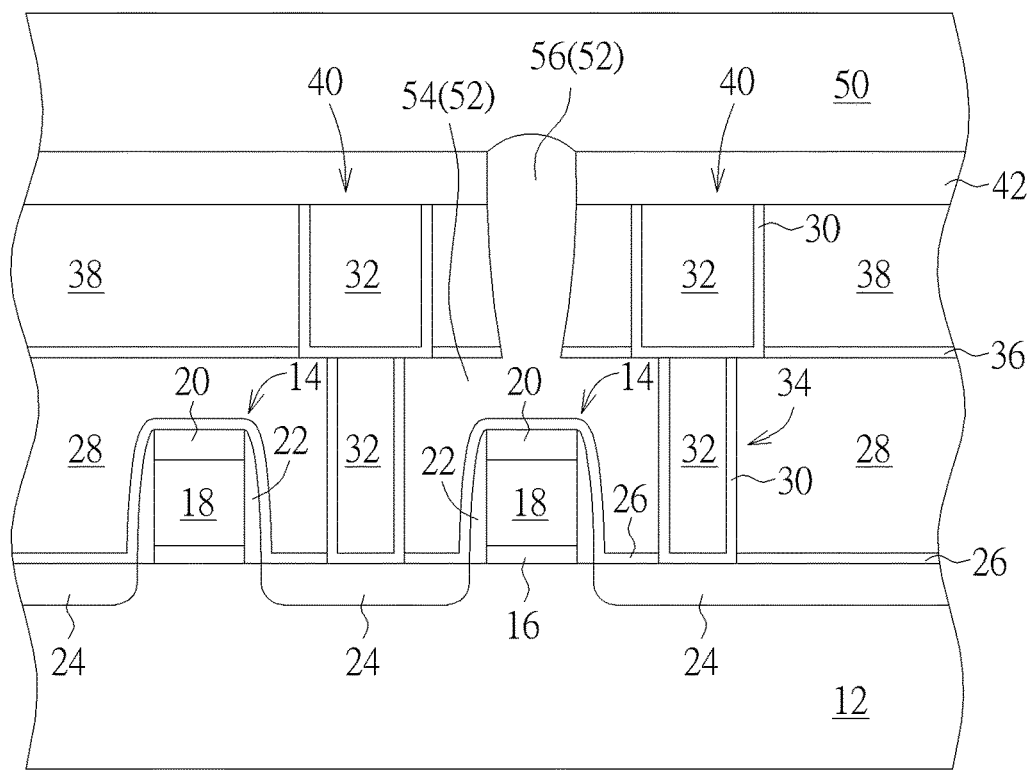

Next, as shown in FIG. 4, another IMD layer 50 is formed on the stop layer 42 without filling the gap between the patterned stop layer 42 and IMD layer 38 to seal off the aforementioned opening 46 and air gap 48 for forming an air gap 52, in which a bottom portion 54 of the air gap 52 includes a substantially reverse U-shape while a top portion 56 of the air gap 52 includes a teardrop shape. Specifically, the bottom portion 54 of the air gap 52 exposes the CESL 26 and sidewalls of the contact plugs 34 while not exposing any part of the gate structure 14 including the hard mask 20 and/or the spacer 22. The top portion 56 of the air gap 52 on the other hand exposes sidewalls of the stop layer 36, sidewalls of the IMD layer 38, sidewalls of the stop layer 42, and bottom surface of the IMD layer 50. The bottom surface of the top portion 56 is preferably even with the bottom surface of the stop layer 36 and the top surface of the top portion 56 is slightly higher than the top surface of the stop layer 42. In this embodiment, the IMD layer 50 could include silicon oxide or ultra low-k (ULK) dielectric layer and the thickness of the IMD layer 50 could be between 3000-5000 Angstroms. This completes the fabrication of a semiconductor device according to an embodiment of the present invention.

It should be noted that the contact plugs 34 disclose in this embodiment pertains to be slot contacts instead of traditional pillar-shape contact structures. Preferably, the contact plugs 34 are dispose adjacent to two sides of the gate structure 14 as the contact plugs 34 and the gate structure 14 are both extending along the same direction on the substrate 12. Hence when the aforementioned etching process were conducted to remove the ILD layer 28 around the gate structure 14, only the ILD layer 28 directly contacting the inner sidewalls of the contact plugs 34 or the ILD layer 28 between the gate structure 14 and the contact plugs 34 would be removed while the ILD layer 28 directly contacting the outer sidewalls of the contact plugs 34 would remain as the contact plugs 34 act as a barrier. As shown in the cross-section view of FIG. 4, only the ILD layer 28 around the gate structure 14 and between the two contact plugs 34 is removed to form the air gap 52 while the ILD layer 28 adjacent to two sides of the contact plugs 34 including the ILD layer 28 on left side of the left contact plug 34 and the ILD layer 28 on right side of the right contact plug 34 are not removed.

Figure 5:
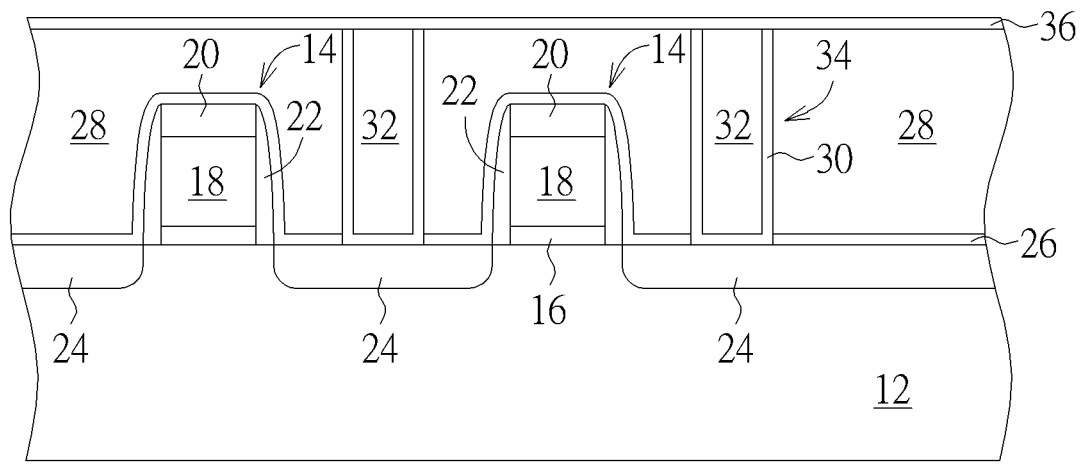
FIGS. 5-7 illustrate a method for fabricating semiconductor device according to an embodiment of the present invention.
Figure 6:
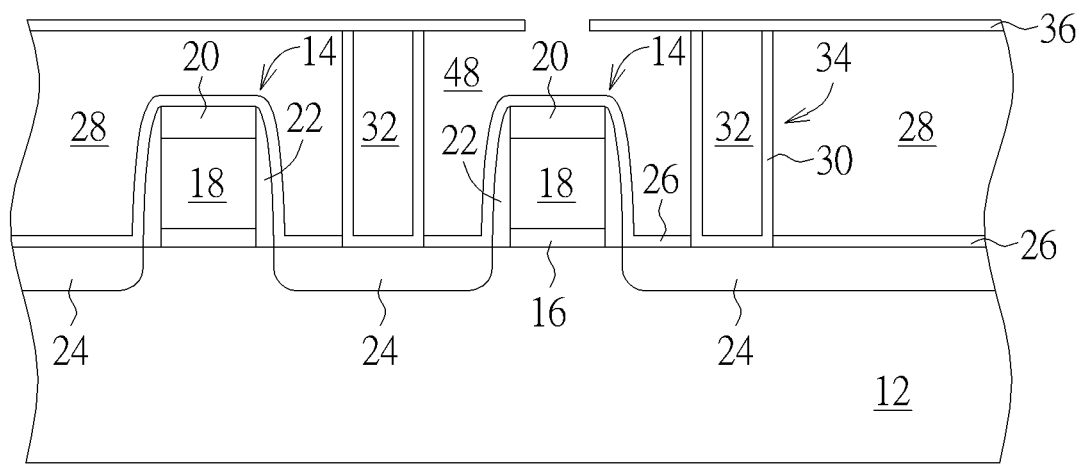
Figure 7:
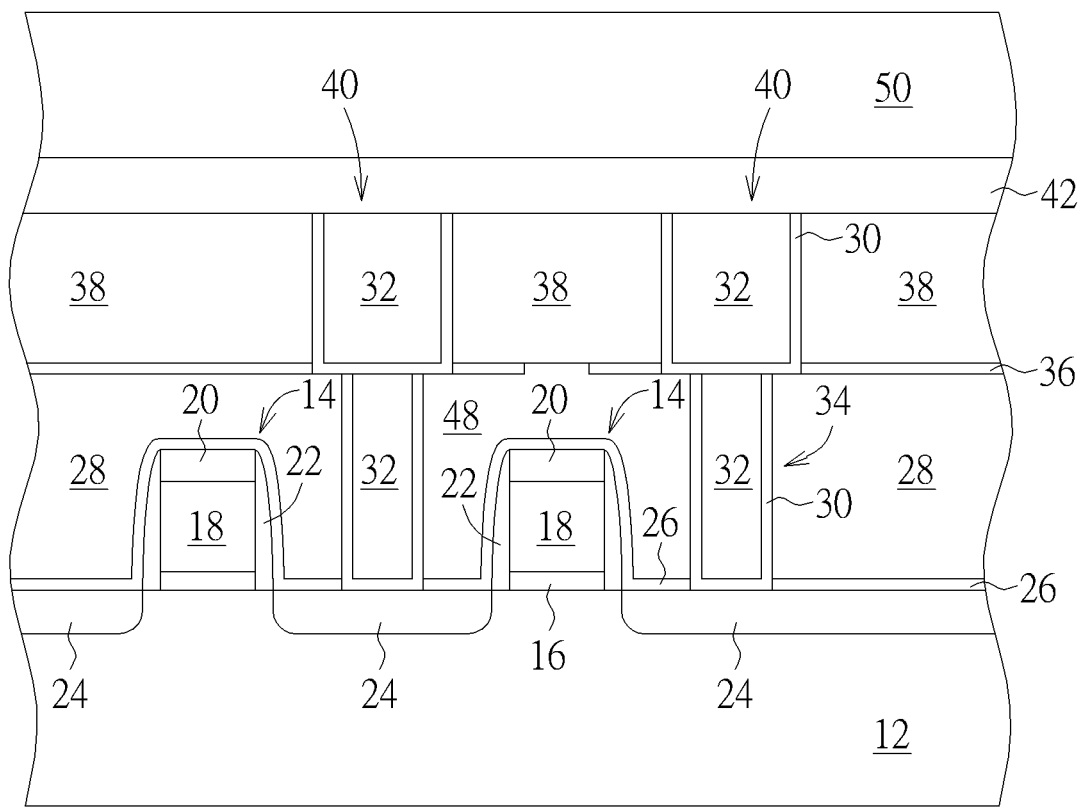

Referring to FIGS. 5-7, FIGS. 5-7 illustrate a method for fabricating semiconductor device according to an embodiment of the present invention. As shown in FIG. 5, it would be desirable to follow the process conducted in FIG. 1 to first form elements including gate structures 14, spacers 22, source/drain regions 24, CESL 26, and ILD layer 28 on the substrate 12, form contact plugs 34 in the ILD layer 28, and then form a stop layer 36 on the ILD layer 28 to cover the contact plugs 34. Similar to the aforementioned embodiment, the stop layer 36 is preferably made of SiCN and the thickness of the stop layer 36 is between 270-330 Angstroms or most preferably 300 Angstroms.

Next, as shown in FIG. 6, a photo-etching process or more specifically a dry etching process is conducted by first forming a patterned mask (not shown) such as patterned resist on the stop layer 36 and then using the patterned mask as mask and fluorine-containing gas as etchant to remove part of the stop layer 36 for exposing the ILD layer 28. Next, another etching process such as a wet etching process is conducted by using the same patterned mask as mask and diluted hydrofluoric acid (dHF) as etchant to remove the ILD layer 28 and expose the CESL 26 on top of the gate structure 14.

Similar to the aforementioned embodiment, the etching process conducted at this stage preferably removes all of the ILD layer 28 around the gate structure 14 and between the two contact plugs 34 for forming an air gap 48 while the ILD layer 28 on left side of the left contact plug 34 and the ILD layer 28 on right side of the right contact plug 34 are not removed at all. Preferably, the air gap 48 exposes the CESL 26 and sidewalls of the contact plugs 34 but not exposing any element of the gate structure 14 including the hard mask 20, the gate material layer 18 or gate electrode, and the spacer 22.

Next, as shown in FIG. 7, an IMD layer 38 is formed on the stop layer 36 to seal off the air gap 48 formed previously, metal interconnections 40 are formed in the IMD layer 38, a stop layer 42 is formed on the IMD layer 38 and metal interconnections 40, and another IMD layer 50 is formed on the stop layer 42. Similar to the aforementioned embodiment, the stop layers 36 and 42 could be made of same material such as SiCN and the IMD layers 38 and 50 could be made of same or different material such as silicon oxide or ultra low-k (ULK) dielectric layer. This completes the fabrication of a semiconductor device according to an embodiment of the present invention.

Structurally, in contrast to the air gap 52 from the aforementioned embodiment including top and bottom portions, the air gap 48 in this embodiment only includes a reverse U-shape surrounding the gate structure 14 as the top surface of the air gap 48 is slightly higher than the top surface of the ILD layer 28 but lower than the bottom surface of the IMD layer 38. It should be noted that to prevent the IMD layer 38 being filled into the air gap 48 around the gate structure 14, the width of the opening gap of the patterned stop layer 36 between air gap 48 and the IMD layer 38 must be less than the gap or distance between the two contact plugs 34. For instance, the width of the gap opening of the patterned stop layer 36 could be less than ½, ⅓, ¼ or less of the distance between two contact plugs 34, less than the width of the gate structure 14, or even less than ½, ⅓, ¼, or less of the width of the gate structure 14, which are all within the scope of the present invention.

Overall, the present invention first forms a stop layer and/or an IMD layer after forming an ILD layer on a gate structure, and then conduct one or more photo-etching process to remove the ILD layer in particular around the gate structure and between two adjacent contact plugs directly contacting the source/drain region for forming an air gap. By using this approach to extend the overall space of the air gap, the present invention is able to improve issues such as RC delay significantly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   forming a gate structure on a substrate;
   forming a contact etch stop layer (CESL) on the gate structure;
   forming an interlayer dielectric (ILD) layer on the CESL;
   forming a contact plug in the ILD layer and adjacent to the gate structure;
   forming a first stop layer on the ILD layer; and
   removing the first stop layer and the ILD layer directly on top of the gate structure and the ILD layer between the CESL and the contact plug to form an air gap exposing the CESL after forming the contact plug.

2. The method of claim 1, further comprising:
   forming a spacer adjacent to the gate structure;
   forming a source/drain region adjacent to the spacer;
   forming the CESL on the gate structure and the source/drain region;
   forming the ILD layer on the CESL;
   forming the contact plug for connecting the source/drain region;
   removing the ILD layer around the gate structure;
   forming an inter-metal dielectric (IMD) layer on the first stop layer to form the air gap; and
   forming a metal interconnection in the IMD layer.

3. The method of claim 1, further comprising forming the air gap to expose the contact plug.

4. The method of claim 1, further comprising:
   forming a spacer adjacent to the gate structure;
   forming a source/drain region adjacent to the spacer;
   forming the CESL on the gate structure and the source/drain region;
   forming the ILD layer on the CESL;
   forming the contact plug for connecting the source/drain region;
   forming a first inter-metal dielectric (IMD) layer on the first stop layer;
   forming a metal interconnection in the first IMD layer;
   forming a second stop layer on the first IMD layer and the metal interconnection;
   forming a hard mask on the second stop layer;
   performing a first etching process to remove the hard mask, the second stop layer, the first IMD layer, and the first stop layer;
   performing a second etching process to remove the ILD layer;
   removing the hard mask; and
   forming a second IMD layer on the first IMD layer for forming the air gap.

5. The method of claim 4, wherein the first etching process comprises a dry etching process.

6. The method of claim 4, wherein the second etching process comprises a wet etching process.

7. The method of claim 4, wherein the air gap comprises:
   a bottom portion exposing the CESL; and
   a top portion exposing the first IMD layer, the second stop layer, and the second IMD layer.

8. The method of claim 4, wherein the hard mask comprises metal nitride.

9. The method of claim 4, wherein a thickness of the first stop layer is less than a thickness of the second stop layer.

10. A semiconductor device, comprising:
    a gate structure on a substrate;
    a contact etch stop layer (CESL) on the gate structure;
    an interlayer dielectric (ILD) layer on the CESL;
    a contact plug in the ILD layer and adjacent to the gate structure;
    a first stop layer on the ILD layer; and
    an air gap around the gate structure and between the CESL and the contact plug and exposing the CESL directly on top of the gate structure.

11. The semiconductor device of claim 10, further comprising:
    a spacer adjacent to the gate structure;
    a source/drain region adjacent to the spacer;
    the CESL on the gate structure and the source/drain region;
    the ILD layer on the CESL;

the contact plug for connecting the source/drain region;
an inter-metal dielectric (IMD) layer on the first stop layer; and
a metal interconnection in the IMD layer.

12. The semiconductor device of claim 11, wherein the air gap exposes the contact plug and the first stop layer.

13. The semiconductor device of claim 10, further comprising:
a spacer adjacent to the gate structure;
a source/drain region adjacent to the spacer;
the CESL on the gate structure and the source/drain region;
the ILD layer on the CESL;
the contact plug for connecting the source/drain region;
a first inter-metal dielectric (IMD) layer on the first stop layer;
a metal interconnection in the first IMD layer;
a second stop layer on the first IMD layer and the metal interconnection; and
a second IMD layer on the first IMD layer.

14. The semiconductor device of claim 13, wherein the air gap comprises:
a bottom portion exposing the CESL; and
a top portion exposing the first IMD layer, the second stop layer, and the second IMD layer.

15. The semiconductor device of claim 13, wherein a thickness of the first stop layer is less than a thickness of the second stop layer.

* * * * *